United States Patent
Järvelä et al.

(10) Patent No.: US 11,152,930 B2
(45) Date of Patent: Oct. 19, 2021

(54) ARRANGEMENT FOR A PHOTODETECTOR CIRCUIT FOR LOW POWER APPLICATIONS, AND A CORRESPONDING METHOD AND A COMPUTER PROGRAM PRODUCT

(71) Applicant: Oura Health Oy, Oulu (FI)

(72) Inventors: Petteri Järvelä, Oulu (FI); Tero Vallius, Oulu (FI)

(73) Assignee: Oura Health Oy, Oulu (FI)

( * ) Notice: Subject to any disclaimer, the term of this patent is extended or adjusted under 35 U.S.C. 154(b) by 169 days.

(21) Appl. No.: 16/394,099

(22) Filed: Apr. 25, 2019

(65) Prior Publication Data

US 2019/0341918 A1 Nov. 7, 2019

(30) Foreign Application Priority Data

May 7, 2018 (FI) ........................... 20185417

(51) Int. Cl.
*G01J 1/44* (2006.01)
*H03F 1/08* (2006.01)
(Continued)

(52) U.S. Cl.
CPC .......... *H03K 17/04166* (2013.01); *G01J 1/44* (2013.01); *H03F 1/083* (2013.01);
(Continued)

(58) Field of Classification Search
CPC ......... H03K 17/7955; H03K 17/04166; H03K 2217/0036; H05B 45/37; G01J 1/44;
(Continued)

(56) References Cited

U.S. PATENT DOCUMENTS 4,495,461 A * 1/1985 Gilliam ................. G01R 29/18
323/325
9,529,079 B1 * 12/2016 Droz ....................... G01S 7/497
(Continued)

FOREIGN PATENT DOCUMENTS

AU 2013228028 A1 3/2015
EP 0310230 A2 4/1989
(Continued)

OTHER PUBLICATIONS

US 5,838,018 A, 11/1998, Mansfield (withdrawn)
(Continued)

*Primary Examiner* — Thanh Luu
*Assistant Examiner* — Monica T Taba
(74) *Attorney, Agent, or Firm* — Holland & Hart LLP

(57) ABSTRACT

The present invention introduces an arrangement for enhancing the performance of an electronic circuit comprising a phototransistor (Q). Either a common-collector or a common-emitter connected phototransistor (Q) has a main resistor ($R_L$), and at least one external bias resistors ($R_{L2}$, $R_{L3}$, $R_{L4}$), each in parallel to one another. The microcontroller may directly control the voltage outputs or act via respective switches (S1, S2) regarding each respective resistor. When the electronic circuit with the phototransistor (Q) is switched on, at least one of the external bias resistors ($R_{L2}$, $R_{L3}$, $R_{L4}$) are switched on. The voltage output rise time is short, and when the bias has been set, the external bias resistor(s) are disconnected functionally. This means that during the actual measurement with the electric circuit, only the main resistor ($R_L$) is used in the connection.

14 Claims, 5 Drawing Sheets

(51) Int. Cl.
*H03K 17/795* (2006.01)
*H03K 17/0416* (2006.01)

(52) U.S. Cl.
CPC .. *H03K 17/7955* (2013.01); *G01J 2001/4406* (2013.01); *G01J 2001/4473* (2013.01)

(58) Field of Classification Search
CPC ...... G01J 2001/4406; G01J 2001/4473; H03F 1/083; H03F 3/3432; A61B 5/02444; A61B 5/0059; A61B 5/0075; A61B 5/024; H01L 31/10; H01L 31/101; H01L 31/00; H04B 10/691
See application file for complete search history.

(56) References Cited

U.S. PATENT DOCUMENTS

| | | |
|---|---|---|
| 2004/0036012 A1 | 2/2004 | Horiguchi et al. |
| 2004/0077324 A1 | 4/2004 | Wieck |
| 2008/0158137 A1 | 7/2008 | Yoshida |
| 2009/0242734 A1 | 10/2009 | Tamegai et al. |
| 2010/0252759 A1* | 10/2010 | Guler ............... E03D 3/06 251/129.04 |
| 2018/0203402 A1* | 7/2018 | Okuma ............... G03G 15/70 |

FOREIGN PATENT DOCUMENTS

| | | |
|---|---|---|
| JP | 2002026369 A | 1/2002 |
| KR | 20010083414 A | 9/2001 |
| WO | 2013165381 A1 | 11/2013 |

OTHER PUBLICATIONS

Finnish Patent and Registration Office, search report of Finnish patent application No. 20185417, dated Nov. 2, 2018, 2 pages.

Tran, Van N. et al, Phototransistor Switching Time Analysis, Application Note 3009, 8 pages, California Eastern Laboratories, retrieved from <http://www.cel.com/pdf/appnotes/an3009.pdf>, retrieved on Apr. 11, 2019.

* cited by examiner

ARRANGEMENT FOR A PHOTODETECTOR CIRCUIT FOR LOW POWER APPLICATIONS, AND A CORRESPONDING METHOD AND A COMPUTER PROGRAM PRODUCT

PRIORITY

This application claims priority of Finnish patent application number FI21085417 which was filed on 7 May 2018, the contents of which are incorporated herein by reference.

TECHNICAL FIELD

The present invention relates generally to battery-operated photodetector systems, and more specifically, to a phototransistor receiving circuit and controlling its set-up time and gain.

BACKGROUND OF THE INVENTION

A low power consumption is a key feature for a wearable battery-operated device. An optical sensor for detecting the heart rate is one of the main power consuming functions in a wearable health monitoring or sleep monitoring device. The power consumption of the optical sensor can be optimized by pulsing the optical light source and/or optical receiver, so that measurement is done by sampling instead of measuring continuously. Between the measuring periods or pulses the transmitter and receiver can be switched off or driven to a low power mode. At the same time, other elements in the system which are connected to the transmitter and receiver can be switched off or set to a low power mode. When the measurement phase starts, all elements have to be switched on or driven to a measurement mode. It is important that all the elements are available quickly and ready almost at the same time for the successful measurement. If one element is slower than the others, all other elements must wait and they are then consuming power in vain.

Typically an optical biosignal detection uses a LED light source which can be green or red or infrared. The light from the LED is directed to the skin of a person. The reflected light from the skin is then received by a photoreceiver, such as a phototransistor. The amplitude of the received signal indicates the blood pulses so that each heartbeat can be detected and heart pulse rate can be defined. Using different LED colour, spectral properties of reflected light can be measured. This can improve accuracy and reliability to define heart pulses and heart rate. Furthermore, with suitable wavelengths (LED colors) other optical parameters can be measured. For example, it is possible to define oxygen saturation level, so called SpO2.

Due to the fact that biosignals are typically slow and at very low frequency band, a light source and receiver can be pulsed instead of keeping it full time ON. The heart rate is typically between 40-200 beats per minute (0.66-3.33 Hz). The heart pressure pulse is a slow changing signal typically consisting signal at 0-10 Hz frequency band. So it is possible and known to pulse an optical transmitter and receiver for example at a frequency of 100-2000 Hz. Using for example 1000 Hz pulsing frequency and 50% duty cycle, the LED is kept ON 0.5 ms and then switched OFF for the next 0.5 ms, and then switching ON again for 0.5 ms and so on. Also it is possible to use measurement periods for measuring heart pulse rate for example once per minute by using for example 10 seconds measuring period and then waiting 50 seconds and then measuring 10 seconds again. During the measurement period the LED and the optical receiver can be continuously on or switched as described above. During the measurement period the heart rate pulses are detected and the average pulse rate is calculated. The rest 50 seconds is a waiting mode meaning that the LED and the optical receiver are switched OFF during that time period to save power. Phototransistors can also be used as electrical isolation elements between two otherwise separate electrical circuit parts. For instance, a LED light as an output signal from the first electrical circuit section can be used as input for the second electrical circuit section comprising the phototransistor, where the detected light from the LED is transformed into a collector output voltage of the phototransistor.

The main problem in the prior art is discussed more in the following.

A photodetector is typically biased by a resistor to $V_{cc}$ (a collector connected to a power supply voltage, for example 3 V), while another pin is connected to the ground (an emitter to GND). A capacitor is often connected from the collector output to the ground (parallel to the photodetector).

There is a strong need to save the consumed electrical power as much as possible, without deteriorating the operations performed by the wearable device. Due to power saving purposes, it is desired to switch the power from all the elements off as often as possible and just to keep them on, when needed during even very short periods. Thus, it is important that switching on the element will happen quickly, i.e. the output voltage ($V_{out}$) of the photoreceiver circuit has to be driven and stabilized quickly to the operational voltage level. The capacitance of the transistor and connected capacitors cause the switched voltage to take time to reach the operational and stable voltage level. Especially the gain of the transistor will extend the capacitor value of the transistor (so called Miller-effect) causing even longer time to reach the operational and stable output voltage level. In prior art solutions, the stabilization time of the photoreceiver circuit output voltage has not been short enough.

A general circuit diagram illustrating a common-emitter circuit structure is shown in FIG. 1A. A phototransistor Q is connected so that its emitter E is connected to ground, base B receives light and the resulting electrical output voltage $V_{out}$ can be seen in the collector C of the phototransistor Q. Resistor $R_L$ is connected between the supply voltage $V_{cc}$ and the collector C.

A general circuit diagram illustrating a common-collector circuit structure, also called as an emitter follower, is shown in FIG. 1B. A phototransistor Q is connected so that its collector C is connected to a supply voltage $V_{cc}$, base B receives light, and the resulting electrical output voltage $V_{out}$ is the emitter voltage, where the emitter E is connected to the ground GND via a resistor $R_L$.

There are different electronic circuit topologies to select the gain and speed of the optoreceiver circuit. Typically the first photoreceiver gain is set low and speed is set high using a small $R_L$. The next circuit blocks after the photoreceiver/phototransistor, namely an amplifier and filter are used for setting the electronics gain and bandwidth i.e. speed to the desired level. This is typicalespecially in integrated ASIC circuits, where it is possible to use multiple amplifier and filter stages and use multiple adjusting elements such as resistors and capacitors and multiple amplification transistors or operational amplifiers. In the case of the simple and miniaturised HW solution using a separate optotransistor and separate hardware components, it is desired to minimize a number of elements and components as their total size will enable to realize the system for example in a small wearable device such as a ring structure. Thus, it is preferred to have a solution with a minimal number of components but still to achieve a good gain and speed.

The problem in common-emitter case (as in FIG. 1A) is that when switching on the supply voltage (for example the 3 V voltage) the collector output starts to load (in the case of a common collector: an emitter output) and it reaches its bias point for example in 100 μs. This means loading the capacitor through the resistor. The resistor is typically set by the gain and bias point to be for example 1-4 kΩ. The capacitor value is for example 0.1 nF. In the case of common-emitter there is also a so-called Miller effect which is a gained base-collector capacitance. An Application Note by California Eastern Laboratories, "Phototransistor Switching Time Analysis" by Van N. Tran, Robert Stuart and Hardik Bhaysar (www link: http://www.cel.com/pdf/app-notes/an3009.pdf), discloses common-emitter amplifier circuit structure and its rise and fall time considerations in page 2, $2^{nd}$ column and in page 3, $1^{st}$ column. This publication proposes to use cascade connected common-collector or common-base configurations to enhance the speed.

At the same time the other receiver electronics components like the amplifier, AD-converter and microcontroller are needed to be switched on to be ready to handle the signal from the photodetector. Due to the fact that the amplifier, AD-converter and microcontroller are using more power and they can be switched faster to be ready, these components need to wait until the photodetector is ready. This results in the problem where these components consume too much excess power during such a waiting period.

Prior art document KR 20010083414 ("Kim") discloses a power saving circuit of monitor. The presented circuit uses a photo coupler PT which includes a photo diode and a photo transistor. FIG. 2 of Kim shows the circuit structure with two transistors Q1 and Q2, rectifier 10 and the photo coupler PT, and two resistors R1 and R2 in connection to the phototransistor in the photocoupler. When the first transistor Q1 is turned off, the photo coupler PT is turned off. When the PT is turned off, the second transistor Q2 turns off a driving power which is applied to an input driving power terminal of a power driving IC 20. Thus, the R1 is the Rood of the photo coupler (comprising the photo transistor) and R2 is a sensing resistor used as a part of a switch. However, there is no disclosure of a multiple bias control for selecting gain and speed.

Prior art document U.S. Pat. No. 5,838,018 ("Mansfield") discloses an intrinsically safe opto-coupler circuit having an optimum data transmission rate. There is a phototransistor Q1 and a second transistor Q2, where the latter has output $V_o$ over collector resistor R3 (see FIG. 2 of Mansfield). The emitter-base junction diode of the second transistor prevents the photo-transistor from saturating and, in so doing, improves the rise and fall times of the collector current of the photo-transistor. This results in an improvement in the data rate of the input signal. Thus, Mansfield discloses a phototransistor Q1 and adjustable load for preventing saturation, but there is no multiple bias control for selecting gain and speed.

Prior art document WO 2013/165381 ("Zhou") discloses feedback-based trans-impedance amplifier with programmable input impedance. The communication device of Zhou includes a photo-diode transforming an optical signal into an electrical current. This signal goes through a lossy transmission line, entering into a feedback based programmable trans-impedance amplifier (PTIA). The impedance of the PTIA is adjusted to match an impedance of the transmission line by an impedance controller 224 (FIG. 2). FIG. 3 illustrates the PTIA architecture where there are transistors M1-M4 with respective drain-side resistors R1-R4 between a high supply reference and the transistors. Further, a variable resistor R_fb (controlled by a control signal) and a capacitor C3 are placed in parallel between a drain of transistor M3 and a gate of transistor M1. Further components C1, C2 and R5 are placed as shown in FIG. 3. The drain of M4 is the output. As a summary, Zhou discloses a photodiode input and transimpedance amplifier with a resistor network with a common control. The main point is the variable resistor R_fb which is a fully different topic than what is discussed here in connection with the invention. There is no disclosure of multiple bias control for selecting gain and speed.

Prior art document AU 2013228028 ("Vanderzon") discloses an opto-coupler speedup circuit. This document speeds up the turn-off time of an opto-coupler without large currents. There are three aspects in the circuit according to FIG. 1 (see abstract). The output circuit for an opto-coupler with an open collector output comprises a pullup resistor, a buffer circuit, a current mirror circuit where the buffer circuit provides an input to the current mirror and the current mirror output is connected to the open collector output. The switching time of an opto-coupler is thus reduced. However, neither Vanderzon discloses the multiple bias control for selecting gain and speed especially to speed up the start-up time.

No prior art discloses the multiple bias control for selecting gain and speed in connection to phototransistor receiver circuits applicable in wearable health or sleep monitoring devices.

SUMMARY OF THE INVENTION

The present invention introduces in its first aspect an arrangement for controlling performance of a photodetector in an electronic circuit, where the photodetector is configured to be sensitive to light. The arrangement comprises a positive supply voltage ($V_{cc}$) port and a ground (GND) port where the photodetector is connected in the electronic circuit between these ports directly or indirectly, and the photodetector is connected via a main resistor ($R_L$) to the positive supply voltage ($V_{cc}$) port or to the ground (GND) port. The present invention is characterized in that the arrangement further comprises an external bias resistor ($R_{L2}$) to be connectable in parallel to the main resistor ($R_L$), a microcontroller which is configured to switch on at least one resistor ($R_L$, $R_{L2}$) at a time by an output signal of the microcontroller, so that when the electronic circuit is configured to be switched on, the microcontroller connects the external bias resistor ($R_{L2}$) on between the photodetector and the positive supply voltage ($V_{cc}$) port, or between the photodetector and the ground (GND) port, for a time period enabling a bias to set for the photodetector, and when the bias has been set, the microcontroller is configured to disconnect functionally the external bias resistor ($R_{L2}$) from the electronic circuit.

In an embodiment of the arrangement, the photodetector is a phototransistor (Q), where its base (B) is sensitive to light.

In an embodiment of the arrangement, a collector (C) of the phototransistor (Q) is connected to the main resistor ($R_L$) and the external bias resistor ($R_{L2}$), and an emitter (E) of the phototransistor (Q) is connected to the ground (GND) port or to a negative supply voltage port.

In an embodiment of the arrangement, a collector (C) of the phototransistor (Q) is connected to the positive supply voltage ($V_{cc}$) port, and an emitter (E) of the phototransistor (Q) is connected to the main resistor ($R_L$) and the external bias resistor ($R_{L2}$).

In an embodiment of the arrangement, the microcontroller is configured to activate at least one of the resistors through direct output voltages, or via a respective switch (S1, S2) connected in series with the respective resistor ($R_L$, $R_{L2}$).

In an embodiment of the arrangement, the microcontroller is configured to activate at least one of the resistors through direct output voltages, and the connection from the resistors ($R_L$, $R_{L2}$) to the ground (GND) port has been removed.

In an embodiment of the arrangement, the electric circuit applies one or more further external bias resistors ($R_{L3}$, $R_{L4}$) connected in parallel with the external bias resistor ($R_{L2}$) and the main resistor ($R_L$).

In an embodiment of the arrangement, the microcontroller is configured to activate at least one of the external bias resistors ($R_{L2}$, $R_{L3}$, $R_{L4}$) during the biasing, and when the bias has been set, the microcontroller is configured to connect only the main resistor ($R_L$) among all the resistors in the electronic circuit.

In an embodiment of the arrangement, during the biasing, the main resistor ($R_L$) is configured to be activated with at least one of the external bias resistors ($R_{L2}$, $R_{L3}$, $R_{L4}$).

In an embodiment of the arrangement, the time period between the connecting and disconnecting instants is selected to be between 2-20 microseconds.

In an embodiment of the arrangement, the resistance of the main resistor ($R_L$) is 1-4 kΩ.

In an embodiment of the arrangement, the resistance of the external bias resistor ($R_{L2}$) is 100-400Ω.

According to a second aspect of the present invention, there is introduced a method for controlling performance of a photodetector in an electronic circuit, where the photodetector is configured to be sensitive to light. The method comprises the steps of:

connecting the photodetector in the electronic circuit between a positive supply voltage ($V_{cc}$) port and a ground (GND) port directly or indirectly, and connecting the photodetector via a main resistor ($R_L$) to the positive supply voltage ($V_{cc}$) port or to the ground (GND) port.

The method is characterized in that the method further comprises the steps of: connecting an external bias resistor ($R_{L2}$) in parallel to the main resistor ($R_L$), switching on at least one resistor ($R_L$, $R_{L2}$) at a time by an output signal of a microcontroller, so that when the electronic circuit is configured to be switched on, the microcontroller connects the external bias resistor ($R_{L2}$) on between the photodetector and the positive supply voltage ($V_{cc}$) port, or between the photodetector and the ground (GND) port, for a time period enabling a bias to set for the photodetector, and when the bias has been set, disconnecting functionally the external bias resistor ($R_{L2}$) from the electronic circuit by the microcontroller.

According to a third aspect of the present invention, there is introduced a computer program product for controlling performance of a photodetector in an electronic circuit, where the photodetector is configured to be sensitive to light. The computer program product comprises program code storable on a computer readable storage medium, the program code being configured to execute the following steps when the program code is run in a microcontroller or in an external processor:

connecting the photodetector in the electronic circuit between a positive supply voltage ($V_{cc}$) port and a ground (GND) port directly or indirectly, and connecting the photodetector via a main resistor ($R_L$) to the positive supply voltage ($V_{cc}$) port or to the ground (GND) port.

The computer program product is characterized in that the program code is further configured to execute the following steps:

connecting an external bias resistor ($R_{L2}$) in parallel to the main resistor ($R_L$), switching on at least one resistor ($R_L$, $R_{L2}$) at a time by an output signal of the microcontroller, so that when the electronic circuit is configured to be switched on, the microcontroller connects the external bias resistor ($R_{L2}$) on between the photodetector and the positive supply voltage ($V_{cc}$) port, or between the photodetector and the ground (GND) port, for a time period enabling a bias to set for the photodetector, and when the bias has been set, disconnecting functionally the external bias resistor ($R_{L2}$) from the electronic circuit by the microcontroller.

DETAILED DESCRIPTION OF THE INVENTION

The following detailed description illustrates embodiments of the present disclosure and ways in which they can be implemented.

The present invention discloses a structure and principle for a circuit comprising a photodetector in a wearable device where gain and speed of the circuit can be enhanced with less consumed power. In an embodiment, the photodetector is a phototransistor.

Concerning the other receiver electronics components like the amplifier, AD-converter and microcontroller, their consumed power can be saved by making the photodetector to wake up faster. Thus, the purpose of the present invention is to make and allow a photodetector to wake up faster and make its output less sensitive to noise and errors.

The circuit according to the invention is implemented with discrete components in a tiny physical structure and with a very low power concerning the adjustment of the gain and shortening of the rise time of the phototransistor circuit. The use of a discrete phototransistor enables to select a thin and small-sized component to be fitted to a small device structure. By connecting a load resistance, $R_L$, directly to the phototransistor enables to keep a number of components small and to save space in a small device structure.

The idea is here discussed to be used in "common-emitter" type of circuit structures, but the concept can be utilized in common-collector circuits as well.

In the present invention, the tuning of the circuit is performed in the front stage of the circuit. This is now discussed in more detail in connection to FIGS. 2-5.

Figure 1B:
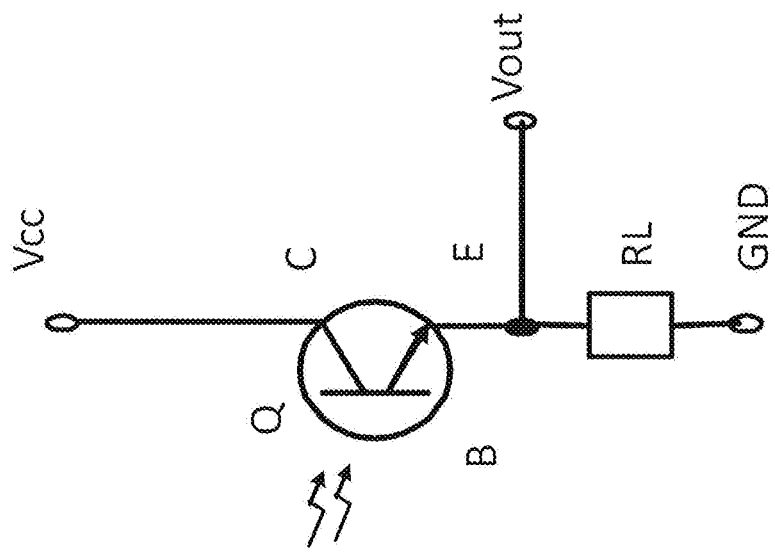
FIG. 1B shows a schematic illustration of a typical common-collector circuit system for a phototransistor in prior art.
Figure 1A:
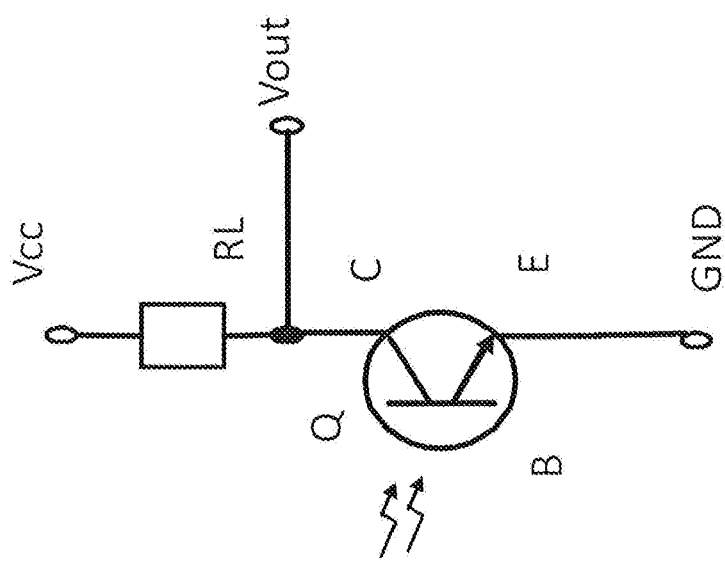
FIG. 1A shows a schematic illustration of a typical common-emitter circuit system for a phototransistor in prior art.
Figure 2C:
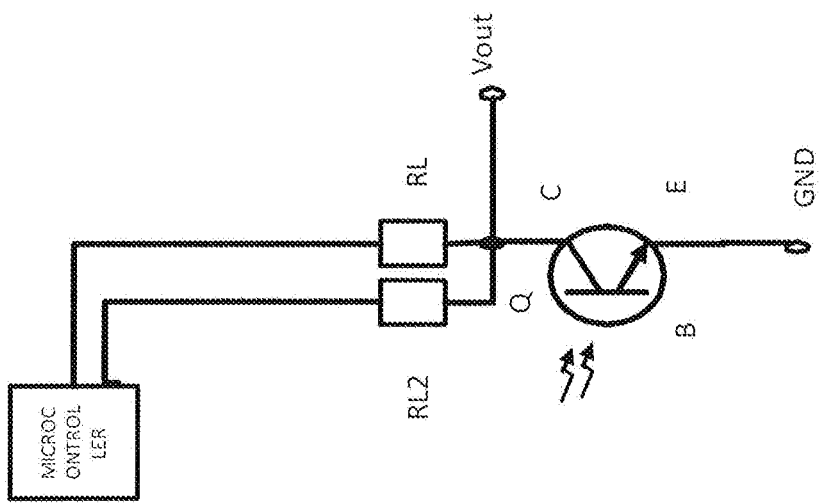
FIGS. 2A, 2B and 2C show schematic illustrations of common-emitter circuits controlled by a microcontroller according to the present invention.
Figure 2B:
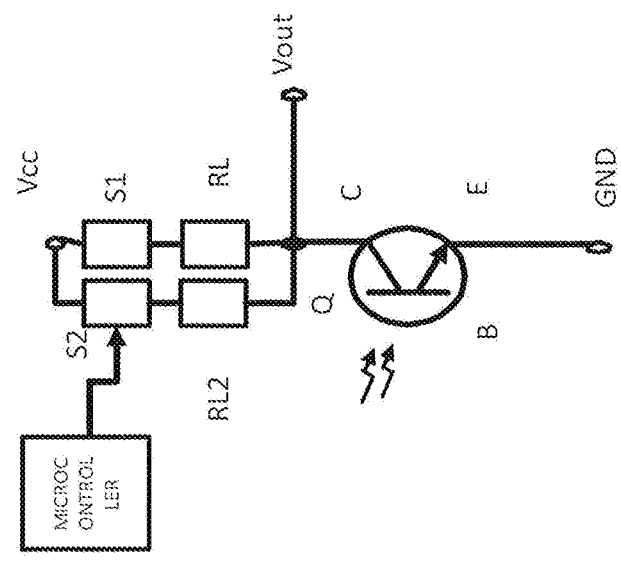
Figure 2A:
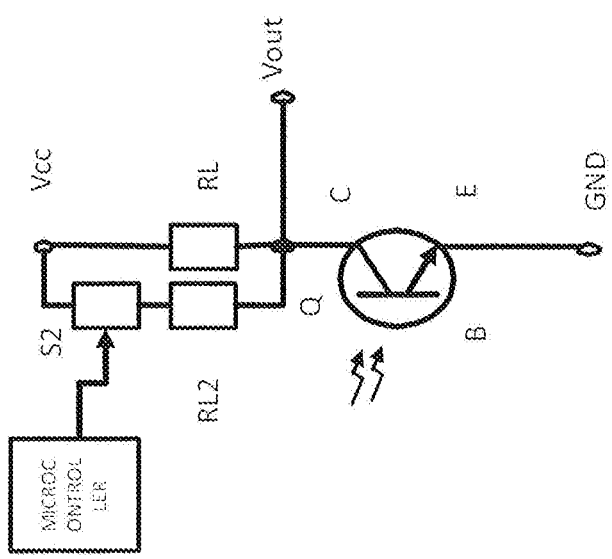

FIG. 2A shows a first schematic illustration of a common-emitter circuit controlled by a microcontroller according to the present invention. In other words, FIG. 2A discloses a first embodiment of the applied circuit structure comprising a photodetector which in this example is a phototransistor Q. The phototransistor Q has a collector C, a base B and an emitter E, where the emitter E is connected to the ground (GND), the collector C is connected to output voltage $V_{out}$ and the base B receives and detects light. Based on the detected light intensity, the phototransistor Q transforms the light information to an electric signal which can be seen as an emerging base current whose magnitude is directly proportional to the intensity of the light. The light is absorbed and detected by the photosensitive semiconductor base region. A collector current is produced based on the base current, and the phototransistor otherwise functions as a regular bipolar junction transistor (BJT).

The supply voltage $V_{cc}$ is connected so that the main resistor $R_L$ is connected between the collector C and the $V_{cc}$. Now going into the inventive circuit components of this embodiment, an external bias resistor $R_{L2}$ is connected in parallel with the main resistor $R_L$ where the external bias resistor $R_{L2}$ acts as an extra resistor. A microcontroller is further set to control a switch S2 where the switch S2 is connected in series with the external bias resistor $R_{L2}$, i.e. between the $V_{cc}$ and the $R_{L2}$.

Now the functional working principle of the presented circuit structure is discussed. A faster bias is set to the photodetector Q by using the external bias resistor $R_{L2}$. In other words, the photodetector Q has an extra connection to the power source $V_{cc}$ from the collector C with a smaller resistor. The resistance of the external bias resistor $R_{L2}$ can be selected to be 5-30 times smaller than the resistance of the main resistor $R_L$. The capacitor (not shown) including a capacitor from the base B to collector C, and from the collector C to emitter E, can be loaded quickly by switching the voltage through the external bias resistor $R_{L2}$. When the capacitor is loaded, the voltage to the external bias resistor $R_{L2}$ can be switched off, and thereafter, the measurement can be done with the main resistor $R_L$ (i.e. the first bias resistor) and its gain. In other words, the external bias resistor $R_{L2}$ is switched on first or together with the main resistor $R_L$. When the photoresistor Q is biased, the external bias resistor $R_{L2}$ is disconnected functionally, and the measurement will be done with the main resistor $R_L$ only.

The differences between the prior art (only $R_L$ used) and the present invention with the external bias resistor $R_{L2}$ are illustrated and discussed in more detail later in connection with FIGS. 5A-B.

FIG. 2B shows a second schematic illustration of a common-emitter circuit controlled by a microcontroller according to the present invention. In other words, FIG. 2B discloses a second embodiment of the applied circuit structure comprising a photodetector which in this example is a phototransistor Q as in the previous embodiment. The second embodiment comprises the phototransistor Q similarly connected as in the first embodiment of FIG. 2A. Furthermore, it comprises the main resistor $R_L$, the external bias resistor $R_{L2}$, the switch S2 and the microcontroller in a similar way as in the first embodiment. Furthermore, the second embodiment comprises additionally a switch S1 in series with the main resistor $R_L$ so that switch S1 and $R_L$ are chained in parallel connection with switch S2 and $R_{L2}$ between the supply voltage $V_{cc}$ and the collector C. Microcontroller is set to control both switches S1 and S2. In the second embodiment, the microcontroller output signal is set to control biasing of the photoresistor Q by connecting either $R_{L2}$, or both the $R_{L2}$ and $R_L$ in parallel. In the latter case with both switches S1 and S2 closed, the combined bias resistance value is:

$$R_{total} = \frac{1}{\frac{1}{R_{L2}} + \frac{1}{R_L}} \tag{1}$$

When the photoresistor Q is biased, the external bias resistor $R_{L2}$ is disconnected functionally by opening the switch S2, and the measurement will be done with the main resistor $R_L$ only through closed switch S1.

FIG. 2C shows a third schematic illustration of a common-emitter circuit controlled by a microcontroller according to the present invention. In other words, FIG. 2C discloses a third embodiment of the applied circuit structure comprising a photodetector which in this example is a phototransistor Q as in the previous embodiments. The third embodiment comprises the phototransistor Q similarly connected as in the first two embodiments of FIGS. 2A-B. This time both the main resistor $R_L$ and the external bias resistor $R_{L2}$ are connected directly to the microcontroller output ports where the microcontroller directly controls either or both output branches by supplying a desired voltage to each desired output port. The output voltages can be freely selected to each of the output ports so that the biasing procedure as explained in the previous embodiments, as well as the measurement itself can be obtained. Thus, the output voltage to its 1st output port may differ from the output voltage to its $2^{nd}$ output port. Also, either or both outputs of the microcontroller can naturally be selected to be in a non-connected state or in very high impedance state, when desired. The voltage pattern as a function of time in each of the output ports can be defined in the microcontroller in programmable means, i.e. by executing a piece of software which is set to direct the voltage outputs as desired or to be non-connected i.e. a resistor is not connected to any voltage or ground.

Figure 3C:
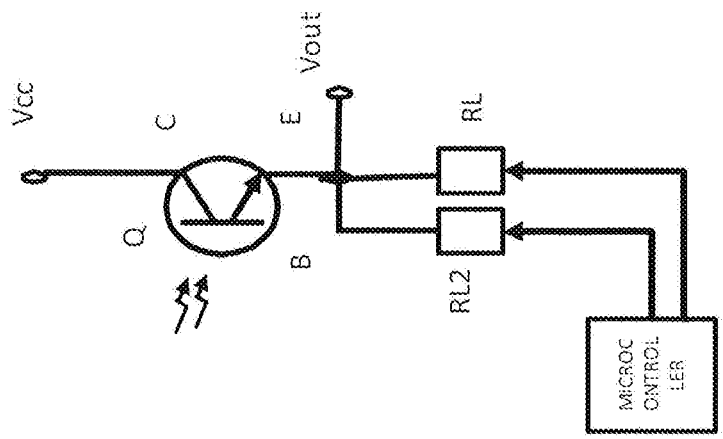
FIGS. 3A, 3B and 3C show schematic illustrations of common-collector circuits controlled by a microcontroller according to the present invention.
Figure 3B:
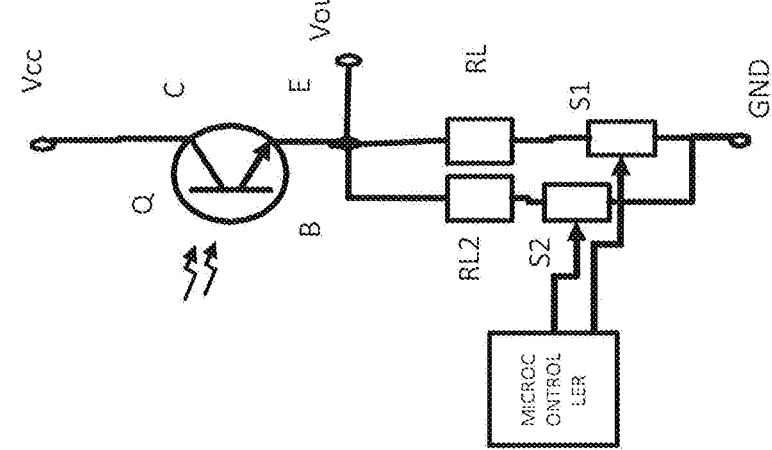
Figure 3A:
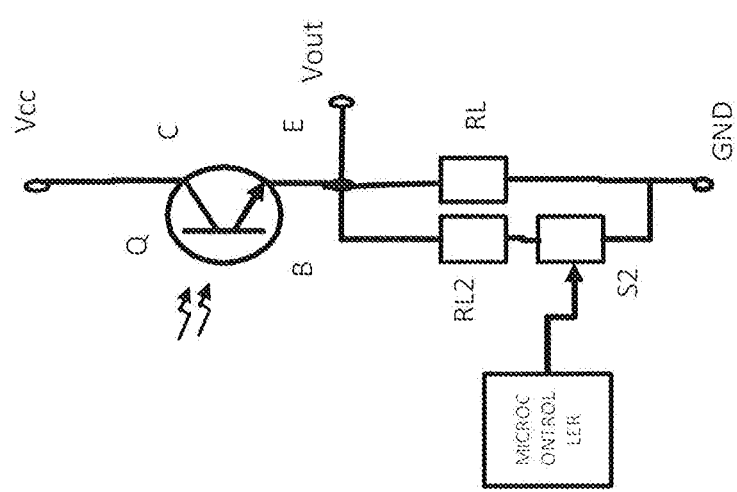

Now going into different kinds of circuit structures, FIGS. 3A-3C illustrate fourth, fifth and sixth embodiments of the invention, which have certain analogy with the FIGS. 2A-2C but they represent now common-collector circuits. In other words, FIG. 3A shows a first schematic illustration of a common-collector circuit controlled by a microcontroller according to the present invention. Thus, FIG. 3A discloses a fourth embodiment of the applied circuit structure comprising a photodetector which in this example is a phototransistor Q. The phototransistor Q has a collector C, a base B and an emitter E, where the collector C is connected to the supply voltage ($V_{cc}$), the emitter E is connected to output voltage $V_{out}$ and the base B receives and detects light. Based on the detected light intensity, the phototransistor Q transforms the light information to an electric signal which can be seen as an emerging base current whose magnitude is directly proportional to the intensity of the light. The light is absorbed and detected by the photosensitive semiconductor base region. A collector current is produced based on the base current, and the phototransistor otherwise functions as a regular bipolar junction transistor (BJT).

The emitter E is further connected so that the main resistor $R_L$ is connected between the emitter E and the ground (GND). Now going into the inventive circuit components of the fourth embodiment, an external bias resistor $R_{L2}$ is connected in parallel with the main resistor $R_L$ where the external bias resistor $R_{L2}$ acts as an extra resistor. A microcontroller is further set to control a switch S2 where the switch S2 is connected in series with the external bias resistor $R_{L2}$, i.e. between the emitter E and the ground (GND).

Now the functional working principle of the presented circuit structure is discussed. A faster bias is set to the photodetector Q by using the external bias resistor $R_{L2}$. In other words, the photodetector Q has an extra connection to the ground GND from the emitter E with a smaller resistor. The resistance of the external bias resistor $R_{L2}$ can be selected to be 5-30 times smaller than the resistance of the main resistor $R_L$. The capacitor (not shown) can be loaded quickly by switching the voltage through the external bias resistor $R_{L2}$. When the capacitor is loaded, the voltage to the external bias resistor $R_{L2}$ can be switched off, and thereafter, the measurement can be done with the main resistor $R_L$ (i.e. the first bias resistor) and its gain. In other words, the external bias resistor $R_{L2}$ is switched on first or together with the main resistor $R_L$. When the photoresistor Q is biased, the external bias resistor $R_{L2}$ is disconnected functionally, and the measurement will be done with the main resistor $R_L$ only.

The differences between the prior art (only $R_L$ used) and the present invention with the external bias resistor $R_{L2}$ are illustrated and discussed in more detail later in connection with FIGS. 5A-B, and this applies also for the fourth, fifth and sixth embodiments of the invention.

FIG. 3B shows a second schematic illustration of a common-collector circuit controlled by a microcontroller according to the present invention. In other words, FIG. 3B discloses a fifth embodiment of the applied circuit structure comprising a photodetector which in this example is a phototransistor Q as in the previous embodiments. The fifth embodiment comprises the phototransistor Q similarly connected as in the fourth embodiment of FIG. 3A. Furthermore, it comprises the main resistor $R_L$, the external bias resistor $R_{L2}$, the switch S2 and the microcontroller in a similar way as in the fourth embodiment. Furthermore, the fifth embodiment comprises additionally a switch S1 in series with the main resistor $R_L$ so that switch S1 and $R_L$ are chained in parallel connection with switch S2 and $R_{L2}$ between the emitter E and the ground GND. Microcontroller is set to control both switches S1 and S2. In the fifth embodiment, the microcontroller output signal is set to control biasing of the photoresistor Q by connecting either $R_{L2}$, or both the $R_{L2}$ and $R_L$ in parallel. In the latter case with both switches S1 and S2 closed, the combined bias resistance value is:

$$R_{total} = \frac{1}{\frac{1}{R_{L2}} + \frac{1}{R_L}} \quad (1)$$

When the photoresistor Q is biased, the external bias resistor $R_{L2}$ is disconnected functionally by opening the switch S2, and the measurement will be done with the main resistor $R_L$ only through closed switch S1.

FIG. 3C shows a third schematic illustration of a common-collector circuit controlled by a microcontroller according to the present invention. In other words, FIG. 3C discloses a sixth embodiment of the applied circuit structure comprising a photodetector which in this example is a phototransistor Q as in the previous embodiments. The sixth embodiment comprises the phototransistor Q similarly connected as in the previous two embodiments of FIGS. 3A-B. This time both the main resistor $R_L$ and the external bias resistor $R_{L2}$ are connected directly to the microcontroller output ports where the microcontroller directly controls either or both output branches by supplying a desired voltage to each desired output port or to be in a non-connected state. The output voltages can be freely selected to each of the output ports so that the biasing procedure as explained in the previous embodiments, as well as the measurement itself can be obtained. Thus, the output voltage to its $1^{st}$ output port may differ from the output voltage to its $2^{nd}$ output port. Also, either or both outputs of the microcontroller can naturally be selected to be in a non-connected state or in very high impedance state, when desired. The voltage pattern as a function of time in each of the output ports can be defined in the microcontroller in programmable means, i.e. by executing a piece of software which is set to direct the voltage outputs as desired. In the sixth embodiment, the connections to the ground GND are removed.

Figures 4A, 4B:
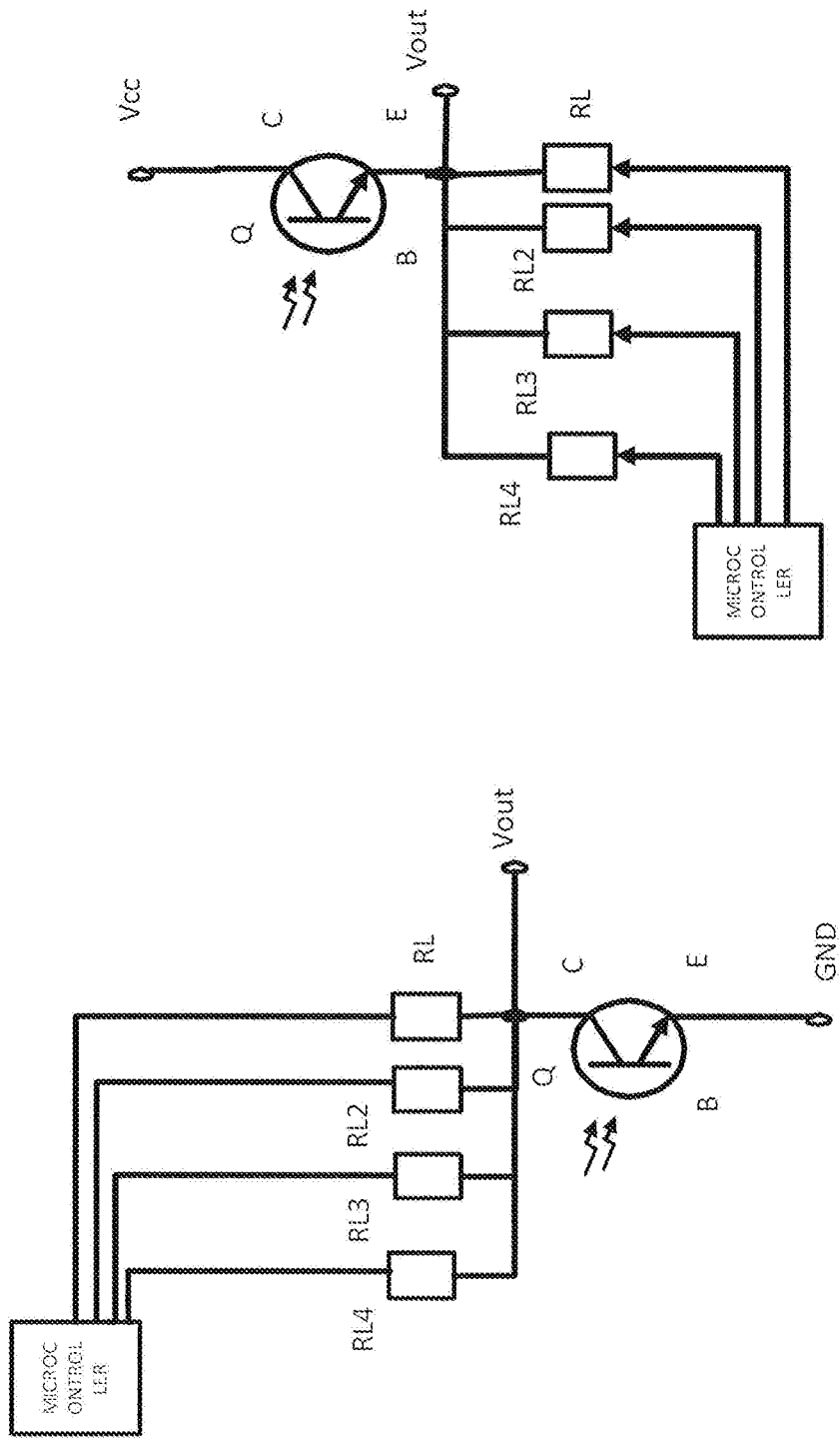
FIG. 4A shows a schematic illustration of a common-emitter circuit controlled by a microcontroller according to the present invention.
FIG. 4B shows a schematic illustration of a common-collector circuit controlled by a microcontroller according to the present invention.

FIG. 4A shows a schematic illustration of a yet another common-emitter circuit structure controlled by a microcontroller according to the present invention. This time the circuit structure applies a group of parallel resistors with different resistance values. This seventh embodiment is a generalization of the third embodiment (FIG. 2C). The circuit structure is the same as in the third embodiment but there are additional resistors $R_{L3}$ and $R_{L4}$ connected separately in parallel with the parallel connection of resistors $R_L$ and $R_{L2}$. Thus, the microcontroller is connected to all four resistors, and it can control each of these resistors by an individual voltage output. Preferably, the main resistor $R_L$ and the external bias resistors $R_{L2}$, $R_{L3}$ and $R_{L4}$ are selected to have different resistance values. In one example, the values could be selected as follows:

$R_L = 4000\ \Omega$ $R_{L2} = \frac{1}{5} * R_L = 800\ \Omega$ $R_{L3} = \frac{1}{10} * R_L = 400\ \Omega$ $R_{L4} = \frac{3}{80} * R_L = 150\ \Omega$ With such a resistor pattern, the output voltage from the microcontroller can be a fixed value of $V_{cc}$ in each of the four branches, or alternatively zero. When the biasing is performed, the desired resistor or a group of resistors are activated through output signals from the microcontroller. After the biasing has been achieved, the three lower control signals from the microcontroller are disconnected from $V_{cc}$, for example setting to an indefinite state i.e a non-connected state or very high impedance state, and only the main resistor $R_L$ is activated through supply voltage $V_{cc}$ from the microcontroller. It is notable that during the biasing of the phototransistor Q, the microcontroller can select any one of the resistors $R_L$-$R_{L4}$, or any two of the four resistors, or any three of the four resistors, or all four resistors of the circuit for the connection. During the actual measurement after the biasing, only $R_L$ is activated by the microcontroller.

FIG. 4B shows a schematic illustration of a yet another common-collector circuit structure controlled by a microcontroller according to the present invention. This time the circuit structure applies a group of parallel resistors with different resistance values, as in the previous embodiment. This eighth embodiment is a generalization of the sixth embodiment (FIG. 3C). The circuit structure is the same as in the sixth embodiment but there are additional resistors $R_{L3}$ and $R_{L4}$ connected separately in parallel with the parallel connection of resistors $R_L$ and $R_{L2}$. Thus, the microcontroller is connected to all four resistors, and it can control each of these resistors by an individual voltage output. Preferably, the main resistor $R_L$ and the external bias resistors $R_{L2}$, $R_{L3}$ and $R_{L4}$ are selected to have different resistance values. In one example, the values could be selected as follows:

$R_L$=4000 Ω

$R_{L2}$=⅕*$R_L$=800 Ω

$R_{L3}$=1/10*$R_L$=400 Ω

$R_{L4}$=1/20*$R_L$=200 Ω

With such a resistor pattern, the output voltage from the microcontroller can be a fixed value of $V_{cc}$ in each of the four branches, or alternatively being in a non-connected state. When the biasing is performed, the desired resistor or a group of resistors are activated through output signals from the microcontroller. After the biasing has been achieved, the three upper control signals from the microcontroller are functionally disconnected and only the main resistor $R_L$ is activated through connecting it to GND or to other fixed voltage value below $V_{cc}$ by the microcontroller. It is notable that during the biasing of the phototransistor Q, the microcontroller can select any one of the resistors $R_L$-$R_{L4}$, or any two of the four resistors, or any three of the four resistors, or all four resistors of the circuit for the connection. During the actual measurement after the biasing, only $R_L$ is activated by the microcontroller.

It is highlighted that the above resistor values from the 7th and 8th embodiments are merely examples, and any other appropriate resistance values can be applied in the present invention.

Figures 5A, 5B:
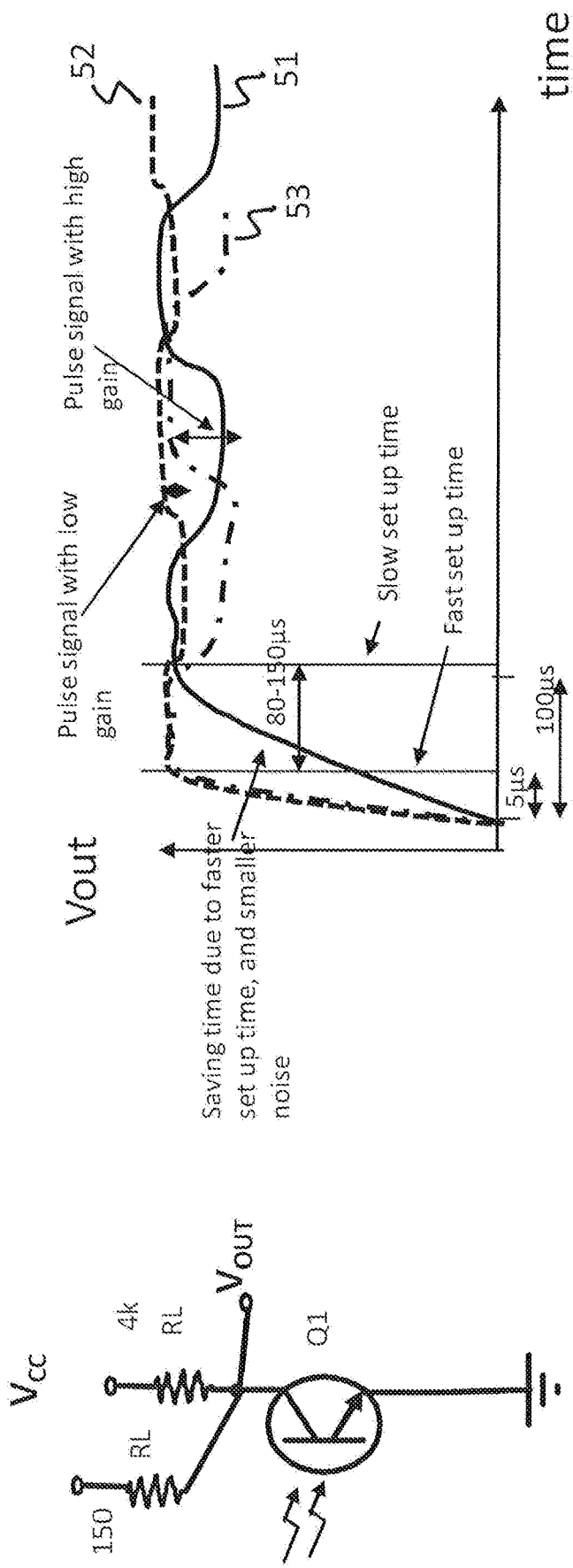
FIG. 5A shows a common-emitter circuit example and FIG. 5B shows a graphic illustration of the set-up time and gain with different $R_L$ values in the common-emitter circuit example of FIG. 5A, as in the present invention compared to the prior art, where the performance of the present invention against two prior art solutions is shown in three different graphs.

FIG. 5A shows a used circuit example with selected resistance values and FIG. 5B shows its graphic result illustration of the set-up time and gain with different $R_L$ values in a common-emitter circuit, as in the present invention compared to the prior art. The situation can be picked from the seventh embodiment in FIG. 4A, where $R_{L2}$ and $R_{L3}$ are functionally disconnected or removed and thus not used. The exemplary values for the resistors $R_L$=4000Ω and $R_{L4}$=150Ω are used in this context regarding the resulting graph of FIG. 5B, the resistor values shown in the common-emitter circuit diagram of FIG. 5A. Now let's discuss three different scenarios with the selection of the resistor branches.

The first method is to use only $R_L$=4000Ω for both the biasing and for the measurement. This means the method according to prior art. The resulting output voltage $V_{out}$ as a function of time is shown as the solid line 51 in FIG. 5B. It illustrates a slow set-up time, a bit over 100 μs in this graph. As it can be seen after the voltage rise time or the set-up time, the behavior of $V_{out}$ show a pulse signal (related optical pulsing input to the base B, not shown) with a relatively high gain because the ratio of the maximum output voltage and the minimum output voltage is relatively high.

The second method is to use only the resistor with the smaller resistance, i.e. $R_L$=$R_{L4}$=150Ω; also part of the prior art. This resistor results in the graph according to the dashed line 52 in FIG. 5B, where the set-up time of the output voltage is significantly shorter, in this case around 5 μs. As it is shown in FIG. 5B, the reduction in the set-up time of the output voltage compared to the first method can be in the range of 80-150 μs (the set-up time difference between the solid 51 and dashed 52 lines). This means that time is saved due to the faster set-up time, and it further means smaller noise and bias voltage fluctuation. However, as it can be seen from the behavior of the dashed line 52 later as a function of time, the amplitude variation of the pulse signal (related optical pulsing input to the base B, not shown) is very small, meaning a very low gain. This is a clear disadvantage.

The third method is the method according to the present invention. This time we use the seventh embodiment with the above values of $R_L$=4000 Ω and $R_{L4}$=150Ω, with the signal branches $R_{L2}$ and $R_{L3}$ as functionally disconnected (i.e. unused). We use first only the smaller resistance 150Ω for the biasing. The result can be seen in the dot-dash line 53 of FIG. 5B. The set-up time for the $V_{out}$ is very short, only around 5 μs. As already discussed above, the reduction in the set-up time of the output voltage according to the invented method compared to the first method can be in the range of 80-150 μs (the set-up time difference between the solid 51 and dot-dash 53 lines), which is a great advantage. After the set-up time has passed from the initiation, the phototransistor is biased, and the microcontroller can right then be arranged to switch the resistors. Thus, after ~5 μs, the larger resistance 4 kΩ is connected for the actual measurements. This means that the $V_{out}$ will behave as a pulsed signal with a high gain value, shown especially after 100 μs when the dot-dash line 53 has clearly notable variation between its maximum and minimum values. This indicates a good signal gain value, which is now combined with the earlier result of a very short set-up time of the signal. This is an advantageous result within the circuits discussed here in connection to physically small, and wearable health and sleep monitoring devices. The present invention indeed achieves both these crucial characteristics by the intelligent switching of the resistors according to any of the above embodiments. Therefore, they represent the advantages of the applied circuitry and its connection logic.

Back to the results emerging from the connection according to the invention, the bias can be set 5-30 times faster, meaning for example in 5 μs instead of 100 μs. This means extreme power saving as the other components do not need to wait the bias setup so long, meaning that this theoretically saves 80-96% of the total power. In practice as the total saving time cannot be found, the power saving is still remarkable 20-80%. Due to the fact that the bias is set faster, the bias is also more stable and not so sensitive because of temperature or other external conditions and therefore, the noise will also be reduced. These are great advantages of the invented solution.

Furthermore, because the I/O output port of the processor directly controls the resistor branches, the tuning of the measurement circuit is indeed performed in the front stage of the measurement circuit. This represents a clear difference to the usual circuit solutions where the gain is adjusted in a subsequent gain control block in the latter stages of the signal processing circuit.

Also because the invented solution is implemented with discrete electrical components within a physically tiny structure in the context of wearable health and sleep monitoring devices, the circuit structures implemented with ASICs are not well suited to the context of the invention. In a preferable embodiment, the wearable health and sleep monitoring device is manufacturing in a form of a wearable ring by a human user. All necessary electrical components and sensors and even a battery can be implemented in such a small physical structure. A charging device can be implemented in a form of a table charger, where the ring can be placed for wireless charging of the battery. A further smartphone app may be connectable to the ring and the charging unit for transferring the measured data from the human user (i.e. from the ring-shaped monitoring device) to be visualized to the user him/herself through the personal smartphone screen. Appropriate radio transceivers are thus applied as well for the data transfer between the ring and the smartphone (or any other personal device, such as a tablet or a PC).

A further advantage is that the circuitry with such an advantageous slow set-up time and high gain can be implemented in a tiny structure allowing various other application areas than just the ones discussed above. Because the present invention can be implemented with a small number of discrete components, and the circuit structure is also simple, a tiny microcontroller is also able to control the invented circuit. All this enables the fact that the desired components can indeed be implemented in a small ring-shaped device which is wearable and convenient for the human user even during his/her sleeping time.

Summarizing the advantages once more for the present invention, the invented circuit structure consumes a very low power level, although a very high sensitivity is indeed needed. It is also notable that the phototransistor detects here pulsed light so there is a need to switch the phototransistor and the whole analog path and the microcontroller off very often and thus, as fast as possible. This further means that the photoreceiver must be switched on within short time periods, which means that the single rise time of the voltage output of the phototransistor must be very short. The presented circuit structure and microcontroller output control logic indeed allow these requirements to be fulfilled.

Thus, the voltage output rise time is very short, good gain characteristics are obtained, and power savings are a notable result of the invented method and arrangement.

The present invention comprises an arrangement, a corresponding method and a corresponding computer program product. All these aspects of the invention comprise the same sub-features, sub-parts and sub-functionalities which are comprised in the dependent arrangement claims.

The present invention is not restricted merely to the embodiments disclosed above but it may vary within the scope of the claims.

The invention claimed is:

1. An arrangement for controlling performance of a photodetector in an electronic circuit, wherein the photodetector is configured to be sensitive to light, the arrangement comprising:
a positive supply voltage (Vcc) port and a ground (GND) port, wherein the photodetector is connected in the electronic circuit between the positive supply voltage (Vcc) port and the ground (GND), and wherein the photodetector is connected to the positive supply voltage (Vcc) port or to the ground (GND) port via at least a main resistor (RL);
an external bias resistor (RL2) to be connectable in parallel to the main resistor (RL);
a microcontroller configured to switch on at least one of the main resistor (RL) and the external bias resistor (RL2) by an output signal of the microcontroller;
the microcontroller configured to connect the external bias resistor (RL2) between the photodetector and the positive supply voltage (Vcc) port, or between the photodetector and the ground (GND) port, for a time period enabling a bias to set for the photodetector based at least in part on the electronic circuit being switched on; and
the microcontroller configured to disconnect functionally the external bias resistor (RL2) from the electronic circuit based at least in part on the bias being set.

2. The arrangement according to claim 1, wherein the photodetector is a phototransistor (Q), wherein a base (B) of the phototransistor (Q) is sensitive to light.

3. The arrangement according to claim 2, wherein a collector (C) of the phototransistor (Q) is connected to the main resistor (RL) and the external bias resistor (RL2), and an emitter (E) of the phototransistor (Q) is connected to the ground (GND) port or to a negative supply voltage port.

4. The arrangement according to claim 2, wherein a collector (C) of the phototransistor (Q) is connected to the positive supply voltage (Vcc) port, and an emitter (E) of the phototransistor (Q) is connected to the main resistor (RL) and the external bias resistor (RL2).

5. The arrangement according to claim 1, wherein the microcontroller is configured to activate at least one of the main resistor (RL) and the external bias resistor (RL2) through direct output voltages, or via a respective switch (S1, S2) connected in series with the respective resistor (RL, RL2).

6. The arrangement according to claim 5, wherein the microcontroller is configured to activate at least one of the main resistor (RL) and the external bias resistor (RL2) through direct output voltages, and the connection from at least one of the main resistor (RL) and the external bias resistor (RL2) to the ground (GND) port has been cut off.

7. The arrangement according to claim 1, wherein the electronic circuit applies one or more further external bias resistors (RL3, RL4) connected in parallel with the external bias resistor (RL2) and the main resistor (RL).

8. The arrangement according to claim 7, wherein the microcontroller is configured to activate at least one of the external bias resistors (RL2, RL3, RL4) during the biasing, wherein the microcontroller is configured to connect only the main resistor (RL) among all the resistors in the electronic circuit based at least in part on the bias being set.

9. The arrangement according to claim 8, wherein during the biasing, the main resistor (RL) is configured to be activated with at least one of the external bias resistors (RL2, RL3, RL4).

10. The arrangement according to claim 1, wherein the time period between the connecting and disconnecting instances is selected to be between 2-20 microseconds.

11. The arrangement according to claim 1, wherein a resistance of the main resistor (RL) is 1-4 kΩ.

12. The arrangement according to claim 1, wherein a resistance of the external bias resistor (RL2) is 100-400 Ω.

13. A method for controlling performance of a photodetector in an electronic circuit, wherein the photodetector is configured to be sensitive to light, the method comprising the steps of:

connecting the photodetector in the electronic circuit between a positive supply voltage (Vcc) port and a ground (GND) port directly or indirectly;

connecting the photodetector via a main resistor (RL) to the positive supply voltage (Vcc) port or to the ground (GND) port;

connecting an external bias resistor (RL2) in parallel to the main resistor (RL);

switching on at least one of the main resistor (RL) and the external bias resistor (RL2) by an output signal of a microcontroller;

connecting the external bias resistor (RL2) between the photodetector and the positive supply voltage (Vcc) port, or between the photodetector and the ground (GND) port, for a time period enabling a bias to set for the photodetector based at least in part on the electronic circuit being switched on; and disconnecting functionally the external bias resistor (RL2) from the electronic circuit by the microcontroller based at least in part on the bias being set.

14. A computer program product for controlling performance of a photodetector in an electronic circuit, wherein the photodetector is configured to be sensitive to light, and wherein the computer program product comprises program code storable on a computer readable storage medium, the program code being configured to execute the following steps when the program code is run in a microcontroller or in an external processor:

connecting the photodetector in the electronic circuit between a positive supply voltage (Vcc) port and a ground (GND) port directly or indirectly;

connecting the photodetector via a main resistor (RL) to the positive supply voltage (Vcc) port or to the ground (GND) port;

connecting an external bias resistor (RL2) in parallel to the main resistor (RL);

switching on at least one of the main resistor (RL) and the external bias resistor (RL2) by an output signal of a microcontroller;

connecting the external bias resistor (RL2) between the photodetector and the positive supply voltage (Vcc) port, or between the photodetector and the ground (GND) port, for a time period enabling a bias to set for the photodetector based at least in part on the electronic circuit being switched on; and disconnecting functionally the external bias resistor (RL2) from the electronic circuit by the microcontroller based at least in part on the bias being set.

* * * * *